United States Patent

Unami

[11] Patent Number: 5,932,951
[45] Date of Patent: Aug. 3, 1999

[54] PIEZOELECTRIC RESONATOR AND ELECTRONIC COMPONENT CONTAINING SAME

[75] Inventor: Toshihiko Unami, Omihachiman, Japan

[73] Assignee: Murata Manufacturing Co., Ltd., Kyoto, Japan

[21] Appl. No.: 08/846,554

[22] Filed: Apr. 30, 1997

[30] Foreign Application Priority Data

Jul. 26, 1996 [JP] Japan .................................. 8-215129
Feb. 5, 1997 [JP] Japan .................................. 9-038350

[51] Int. Cl.⁶ .................................................. H01L 41/08
[52] U.S. Cl. ........................ 310/315; 310/346; 310/348; 310/366
[58] Field of Search ................................... 310/315, 320, 310/321, 323, 328, 366, 344, 348, 346, 365

[56] References Cited

U.S. PATENT DOCUMENTS

| | | | |
|---|---|---|---|
| 2,157,665 | 5/1939 | Hollmann | 310/315 |
| 2,998,535 | 8/1961 | Church | 310/325 |
| 3,185,869 | 5/1965 | Shoor | 310/315 |
| 3,187,207 | 6/1965 | Tomes | 310/325 |
| 3,297,889 | 1/1967 | Breskend | 310/315 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/328 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FOREIGN PATENT DOCUMENTS

| | | | |
|---|---|---|---|
| 5-160459 | 6/1993 | Japan | 310/366 |
| 1331100 | 9/1973 | United Kingdom | 310/314 |

*Primary Examiner*—Mark O. Budd
*Attorney, Agent, or Firm*—Graham & James LLP

[57] ABSTRACT

A piezoelectric resonator includes a base member having a piezoelectric member at the center and dielectric members disposed at opposite ends. A plurality of internal electrodes are provided in the base member. The piezoelectric member layer at the center of the base member is polarized in the longitudinal direction of the base member in opposite directions at both sides of each internal electrode. The center section of the base member is used as a vibrating section. On the other hand, the dielectric members at both ends of the base member are not polarized and are used as capacitor sections. Adjacent internal electrodes are connected to external electrodes serving as input and output electrodes, respectively.

20 Claims, 11 Drawing Sheets

10

10a(10b,10c,10d)

PIEZOELECTRIC RESONATOR AND ELECTRONIC COMPONENT CONTAINING SAME

BACKGROUND OF THE INVENTION

1. Field of the Invention

The present invention relates to novel piezoelectric resonators and electronic components containing such novel piezoelectric resonators, and more particularly, to a piezoelectric resonator which maximizes the efficient use of mechanical resonance of a novel piezoelectric member, and electronic components containing the novel piezoelectric resonator, such as a ladder filter, an oscillator, a discriminator, and a filter.

2. Description of the Related Art

FIG. 15 is a perspective view of a novel piezoelectric resonator which the applicant has developed but has not yet published. FIG. 16 is a view showing the internal structure of the piezoelectric resonator shown in FIG. 1. A piezoelectric resonator 1 includes a base member 2 having, for example, a substantially rectangular-parallelpiped shape. The base member 2 is preferably formed by integrally laminating a plurality of piezoelectric layers with electrodes 3 disposed therebetween and also disposed preferably on external surfaces of the piezoelectric layers. The piezoelectric layers are preferably made from piezoelectric ceramic. The electrodes 3 are disposed to be substantially perpendicular to a longitudinal direction of the base member 2 and they preferably have a certain space therebetween. The electrodes 3 are preferably not disposed near two opposite ends of the base member 2 in the longitudinal direction.

On opposite side surfaces of the base member 2, a plurality of insulating films 5 and 6 are provided, respectively. On the one side surface of the base member 2, alternate exposed portions of the electrodes 3 are covered by the insulating film 5. On the other side surface of the base member 2, alternate exposed portions of the electrodes 3 which are not covered by the insulating film 5 on the above-described side surface are covered by the insulating film 6.

On the side surfaces of the base member 2 on which the insulating films 5 and 6 are provided, that is, connection sections, external electrodes 7 and 8 are disposed. Therefore, the external electrode 7 is connected to electrodes 3 which are not covered by the insulating film 5 and the external electrode 8 is connected to electrodes 3 which are not covered by the insulating film 6. In other words, adjacent electrodes among the electrodes 3 are connected to the external electrodes 7 and 8, respectively. The external electrodes 7 and 8 are used as input and output electrodes.

In the piezoelectric resonator 1, the piezoelectric layers are preferably polarized in opposite directions at both sides of an electrode 3 in the longitudinal direction of the base member 2 as shown in FIG. 16. An active vibrating section 4 is defined as shown by hatching in FIG. 15.

Since the piezoelectric resonator shown in FIGS. 15 and 16 is a stiffened type resonator, it has a larger electromagnetic coupling coefficient than a conventional unstiffened piezoelectric resonator. It also has a relatively large ΔF, which is a difference between the resonant frequency Fr and the antiresonant frequency Fa. A resonator having a large ΔF is well suited for use in a wide-frequency-band filter.

A narrow-frequency-band filter and an oscillator may, however, require a small ΔF. To obtain a small ΔF, the area of each electrode, or the size or thickness of the piezoelectric layers must be changed in the piezoelectric resonator 1 shown in FIGS. 15 and 16, which causes difficulties in design and manufacturing.

SUMMARY OF THE INVENTION

To overcome the problems as described above, the preferred embodiments of the present invention provide a piezoelectric resonator having a simple structure and a small ΔF which makes the piezoelectric resonator very well suited for use in a narrow-frequency-band filter and an oscillator.

According to one preferred embodiment of the present invention, a piezoelectric resonator comprises a base member; a vibrating section constituting a part of the base member and including at least one piezoelectric member and at least one pair of electrodes which sandwich at least a first part of the piezoelectric member and are disposed substantially perpendicularly to a longitudinal direction of the base member; and a capacitor section constituting a second part of the base member and being electrically connected in a parallel to the vibrating section, wherein the piezoelectric member in the vibrating section is formed such that the piezoelectric member is polarized in the longitudinal direction of the base member and an electric field is applied in the longitudinal direction to the base member between the electrodes to generate a basic longitudinal vibration in the base member.

According to another preferred embodiment of the present invention, a piezoelectric resonator comprises a base member; a vibrating section constituting a first part of the base member and including at least one piezoelectric member and at least one pair of electrodes which sandwich at least part of the piezoelectric member and are disposed substantially perpendicularly to a longitudinal direction of the base member; and a capacitor section constituting a second part of the base member and being electrically connected in parallel to the vibrating section, wherein the piezoelectric member in the vibrating section is arranged such that the piezoelectric member is polarized in the longitudinal direction of the base member and an electric field is applied in the longitudinal direction to the base member between the electrodes to generate a basic longitudinal vibration in the base member, and the capacitor section has a capacitor including at least one pair of electrodes disposed in a dielectric member which is not polarized.

The piezoelectric resonator may be formed such that it further includes at least one pair of external electrodes disposed on an external surface of the base member and connected to at least the one pair of electrodes provided in the base member and the capacitor section is connected between the pair of external electrodes and electrically connected in parallel to the vibrating section.

According to another preferred embodiment of the present invention, a piezoelectric resonator comprises a base member; a vibrating section constituting a first part of the base member and including at least one piezoelectric member and at least one pair of internal electrodes which sandwich at least a part of the piezoelectric member and are disposed substantially perpendicularly to a longitudinal direction of the base member; and a capacitor section constituting a second part of the base member and being electrically connected in parallel to the vibrating section, wherein the internal electrodes are connected to at least one pair of external electrodes disposed on an outer surface of the base member, the piezoelectric member in the vibration section is formed such that the piezoelectric member is polarized in the longitudinal direction of the base member and an electric field is applied in the longitudinal direction to the base member between the electrodes to generate basic longitudinal vibration in the base member, and the capacitor section has a capacitor including at least one pair of external electrodes disposed at an outer surface of a non-polarized dielectric member constituting a part of the base member.

According to yet another preferred embodiment of the present invention, a piezoelectric resonator comprises a base member; a vibrating section constituting a first part of the base member and including at least one piezoelectric member and at least one pair of internal electrodes which sandwich at least a part of the piezoelectric member and are disposed substantially perpendicularly to a longitudinal direction of the base member; and a capacitor section constituting a second part of the base member and being electrically connected in a parallel to the vibrating section, wherein the internal electrodes are connected to at least one pair of external electrodes disposed at an outer surface of the base member, the piezoelectric member in the vibration section is formed such that the piezoelectric member is polarized in the longitudinal direction of the base member, and an electric field is applied to the base member in the longitudinal direction between the electrodes to generate basic longitudinal vibration in the base member, and the capacitor section has a capacitor which includes one of the internal electrodes and at least one of the at least one pair of external electrodes disposed at an outer surface of a non-polarized dielectric member constituting a part of the base member.

In the above-described piezoelectric resonators, the vibrating section may be formed by alternately laminating a plurality of the piezoelectric members and a plurality of the electrodes.

In the above-described piezoelectric resonator, the capacitor section may be formed at a periphery of the vibrating section.

According to a further preferred embodiment of the present invention, an electronic component contains the above-described novel piezoelectric resonator, wherein a support member for supporting the base member includes an insulating substrate having a pattern electrode disposed on a surface of the substrate; the base member is mounted on the insulating substrate via a mounting member for supporting a center section of the base member of the piezoelectric resonator; and a cap is disposed on the insulating substrate so as to cover the base member.

In accordance with a yet another preferred embodiment of the present invention, an electronic component comprises a plurality of the above-described novel piezoelectric resonators, wherein a support member for supporting the piezoelectric resonators includes an insulating substrate having a pattern electrode disposed therein; a plurality of the piezoelectric resonators mounted on the insulating substrate via mounting members for supporting center sections of the base members in the longitudinal direction so as to configure a ladder filter; and a cap is disposed on the insulating substrate so as to cover the piezoelectric resonators.

In the piezoelectric resonator of the preferred embodiments of the present invention, longitudinal basic vibration is generated in the base member by the vibrating section. This vibration is generated in the stiffened piezoelectric resonator, in which the vibration direction, the direction of polarization, and the direction in which an electrical field is applied are the same in the vibrating section. Therefore, vibrations in modes such as the width and thickness modes, which are different from the basic vibration, are unlikely to occur and superior characteristics are obtained.

Since the capacitor section is connected in parallel to the vibrating section, $\Delta F$ in the basic longitudinal vibration is easily changed by adjusting the capacitor section. When a plurality of dielectric members and a plurality of electrodes are alternately laminated to form a capacitor section and the thickness of the dielectric layers is constant, $\Delta F$ becomes small as the number of dielectric layers increases.

The capacitor section preferably includes a capacitor disposed between electrodes provided in the dielectric members, a capacitor disposed between one pair of external electrodes disposed at the outer surface of the dielectric members, and a capacitor disposed between at least one of the external electrodes disposed at the outer surface of the dielectric members and an electrode disposed inside the dielectric members. Among these capacitors, least one capacitor is connected in parallel to the vibrating section.

When an electronic component such as a ladder filter, an oscillator, a discriminator, and a filter is made using this piezoelectric resonator, the piezoelectric resonator is preferably mounted on an insulating substrate having pattern electrodes are disposed therein and is covered by a cap to form chip-type, surface-mountable electronic components.

According to the preferred embodiments of the present invention, since the difference $\Delta F$ between the resonant frequency and the antiresonant frequency can be easily adjusted in a wide range by adjusting the capacitor section, a piezoelectric resonator having a small $\Delta F$ is obtained. Therefore, a piezoelectric resonator having a small $\Delta F$ is obtained. Therefore, a piezoelectric resonator which well suited for use in a narrow-frequency-band filter and an oscillator is obtained according to the preferred embodiments of the present invention.

Since a chip-type electronic component can be made using the novel piezoelectric resonator according to the preferred embodiments of the present invention, it is easy to mount the component on a circuit board.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
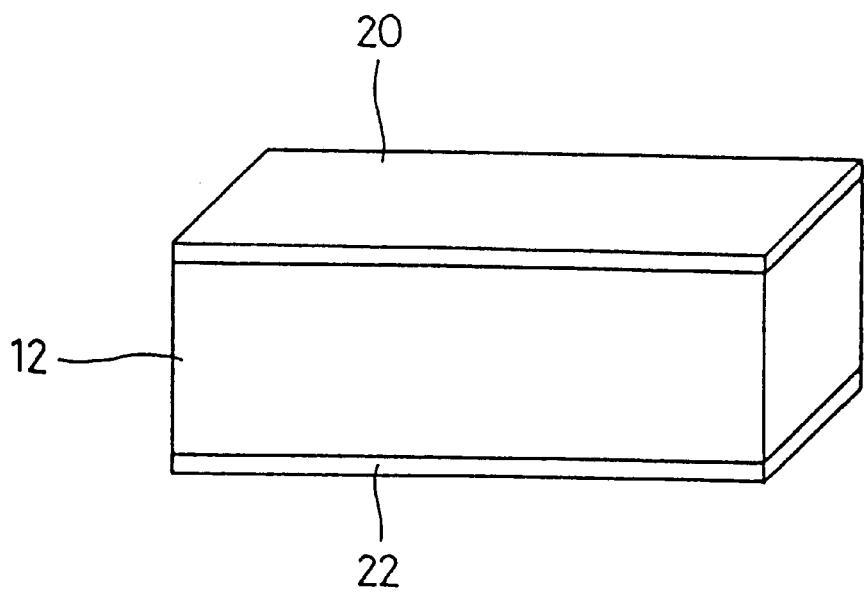
FIG. 1 is a perspective view of a piezoelectric resonator according to a preferred embodiment of the present invention.
Figure 2:
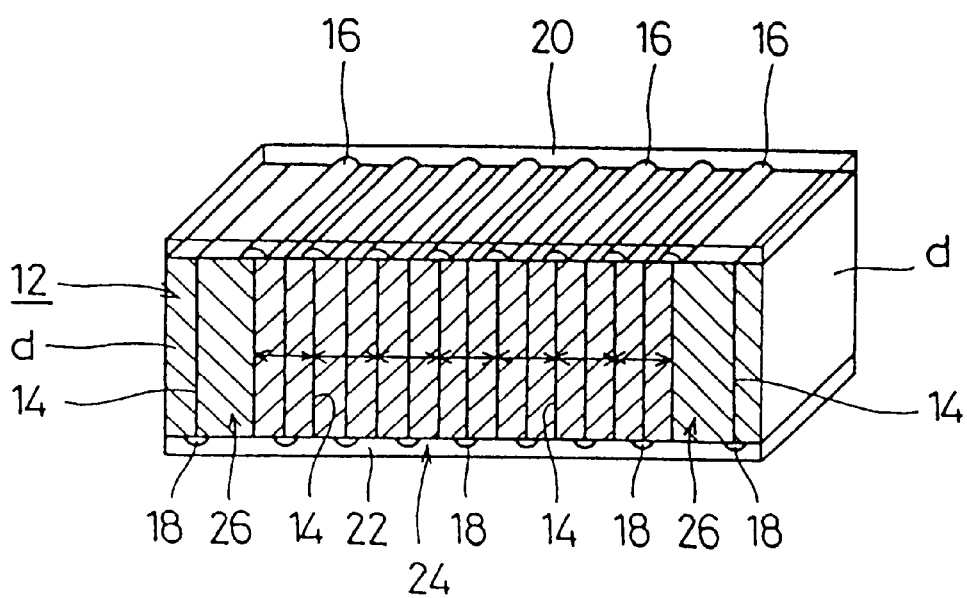
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. The piezoelectric resonator 10 includes a base member 12 having, for example, a substantially rectangular-parallelpiped shape. In the base member 12, a plurality of electrodes 14 are arranged such that each major surface of each electrode 14 is substantially perpendicular to a longitudinal direction of the base member 12 and a certain interval is provided between the electrodes 14. A vibrating section 24 is preferably provided substantially at the center of the base member 12 by integrally laminating a plurality of piezoelectric layers and the electrodes 14 disposed therebetween. The piezoelectric layers are preferably made from piezoelectric ceramic material such as PZT. A plurality of piezoelectric layers constituting the vibrating section 24 are polarized in opposite directions at both sides of each electrode 14 in the longitudinal direction of the base member 12 as shown by arrows in FIG. 2.

At both sides of the vibrating section 24, piezoelectrically inactive sections "d" are preferably provided by laminating dielectric layers and electrodes 14. In the inactive sections "d", the dielectric layers are sandwiched by the electrodes 14. Since the dielectric layers are not polarized, even if an electric field is applied, the inactive sections are piezoelectrically inactive. The inactive sections 'd' are preferably laminated together with the vibrating section 24 such that the vibrating section 24 is sandwiched by the inactive sections of opposite ends of the base member 12. The dielectric layers according to the present preferred embodiment are preferably made from unpolarized piezoelectric ceramic such as PZT. A dielectric in the description of the present invention refers to all materials having a dielectric constant. A material having a large dielectric constant such as $BATiO_3$ may be used instead of the above-described unpolarized piezoelectric member. Other suitable materials may be also considered.

On opposing side surfaces of the base member 12, a plurality of insulating films 16 and 18 are provided. On a first side surface of the base member 12, the insulating film 16 covers the exposed section of every other electrode 14. On a second side surface of the base member 12, the insulating film 18 covers the exposed section of every other electrode 14 not covered by the insulating film 16 on the first side surface. The two side surface of the base member 12 on which the insulating films 16 and 18 are provided serve as connection sections to external electrodes, which will be described later.

In these connection sections, namely, the entire areas of the side surfaces of the base member 12 on which the insulating films 16 and 18 are disposed, external electrodes 20 and 22 are provided. The external electrode 20 connects to electrodes 14 which are not covered by the insulating film 16, and the external electrode 22 connects to electrodes 14 which are not covered by the insulating film 18. In other words, adjacent electrodes 14 are connected to the external electrodes 20 and 22, respectively. The external electrodes 20 and 22 are used as input and output electrodes.

Figure 3:
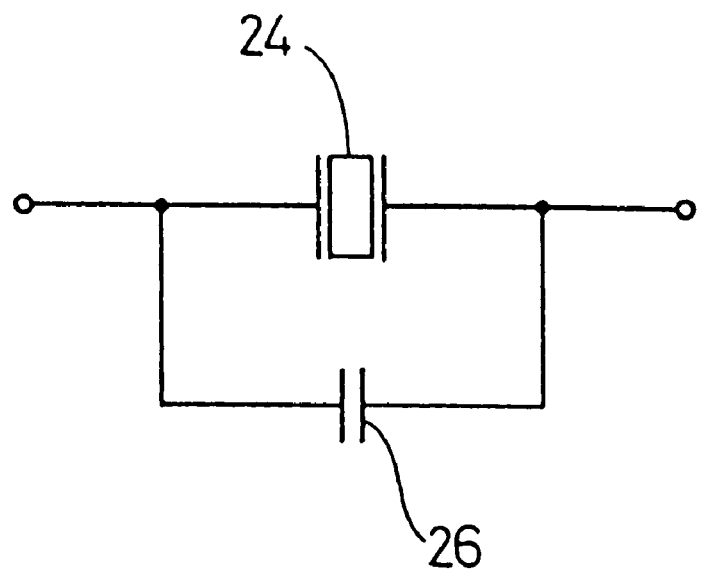
FIG. 3 is a circuit diagram of a piezoelectric resonator according to a preferred embodiment of the present invention.

In the piezoelectric resonator 10, since the inactive sections "d" have a structure in which the dielectric layers and the electrodes 14 are laminated, the inactive sections "d" include capacitors. A capacitor is defined between opposing electrodes 14. Since the opposing electrodes 14 are connected to the external electrodes 20 and 22, respectively, the external electrodes 20 and 22 have a capacitor disposed between them. Since the two external electrodes 20 and 22 oppose each other with the dielectric layers disposed therebetween, another capacitor is also formed between the external electrodes 20 and 22. In addition, between the external electrodes 20 and an electrode 14 which is not connected thereto, and between the external electrode 22 and an electrode 14 which is not connected thereto, capacitors are formed. Therefore, a desired capacitance made be provided by combining these plural capacitors formed between the external electrodes 20 and 22. The inactive sections "d" preferably include capacitor sections 26. FIG. 3 shows the equivalent circuit diagram of the piezoelectric resonator 10. As shown in FIG. 3, the vibrating section 24 is connected in parallel to the capacitor sections 26 in the piezoelectric resonator 10.

When a signal is applied to the external electrodes 20 and 22 in this piezoelectric resonator 10, voltages are applied in opposite directions to the piezoelectric layers which are polarized in opposite directions. Then, the vibrating section 24 expands and contracts as an integral unit in the same direction. Therefore, the entire piezoelectric resonator 10 vibrates in the longitudinal direction in a basic mode with a node being defined at substantially the center of the base member 12 when an AC electric field is applied. In the piezoelectric resonator 10, the polarization direction of the vibrating section 24, the applied electric field direction and the direction of vibration in the vibrating section 24 are all the same. In other words, the piezoelectric resonator 10 is a stiffened type resonator. As a result, the piezoelectric resonator 10 has a larger electromagnetic coupling coefficient than an unstiffened piezoelectric resonator, in which the direction of vibration differs from the direction of polarization and the electric field. Vibrations in modes such as the width and thickness modes, which are different from the basic vibration, is unlikely to occur and superior resonator characteristics are obtained.

Since the capacitor sections 26 are connected in parallel to the vibrating section 24 in the piezoelectric resonator 10 as shown in FIG. 3, ΔF in the basic longitudinal vibration can be easily adjusted by adjusting the capacitor sections 26. As the capacitance in the dielectric layers increases, for example, a damping capacitance also increases, and ΔF becomes smaller.

Therefore, in the piezoelectric resonator 10 according to the present preferred embodiment, ΔF can be adjusted in a wide range and a high degree of freedom and flexibility in design of resonator characteristics is achieved. The piezoelectric resonator 10 can have a small ΔF and is very well suited to be used in a narrow-frequency-band filter and an oscillator.

Also in the piezoelectric resonator 10 according to the present preferred embodiment, ΔF can be easily adjusted in a wide range by changing the ratio of the vibrating section 24 to the capacitor sections 26 or by changing the positions of the capacitor sections 26 in relation to the vibrating section 24. In the piezoelectric resonator shown in FIGS. 1 and 2, the capacitor sections 26 are preferably disposed at opposite ends of the vibrating section 24. However the structure is not limited to this arrangement. As the capacitor sections 26 are located closer to the center of the base member 12, ΔF becomes smaller.

The capacitance of the entire piezoelectric resonator 10 can be easily increased by adjusting the capacitance of the capacitor sections 26. The capacitance of the capacitor sections 26 is adjusted by changing the common or overlapping area of the opposing portions of the electrodes 14 as seen from a direction perpendicular to the major surfaces of the electrodes or the thickness of the dielectric layers. In the piezoelectric resonator 10 described above, the dielectric layers are preferably thicker than the piezoelectric layers as shown in FIG. 2. However, the structure is not limited to this particular thickness relationship. The dielectric layers may be formed to have the same thickness as the piezoelectric layers. The dielectric layers may also be formed to be thinner than the piezoelectric layers.

In the preferred embodiments of the present invention, the capacitor sections 26 may be formed by laminating a plurality of dielectric layers with electrodes 14 disposed therebetween. Also in this case, the capacitor sections 26 are connected in parallel to the vibrating section 24. As the number of the laminated layers increases, ΔF becomes smaller and the capacitance increases.

In the piezoelectric resonator 10, the capacitance of the entire piezoelectric resonator 10 can easily be adjusted by adjusting the number of the piezoelectric layers constituting the vibrating section 24.

Figure 4:
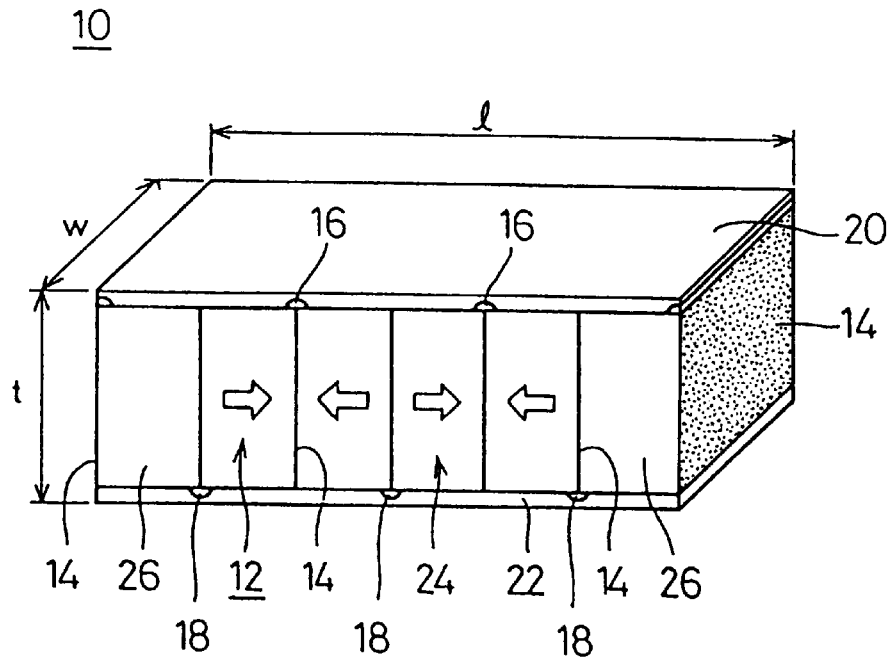
FIG. 4 is a view of a piezoelectric resonator according to a preferred embodiment of the present invention used for checking the characteristics.
Figure 5:
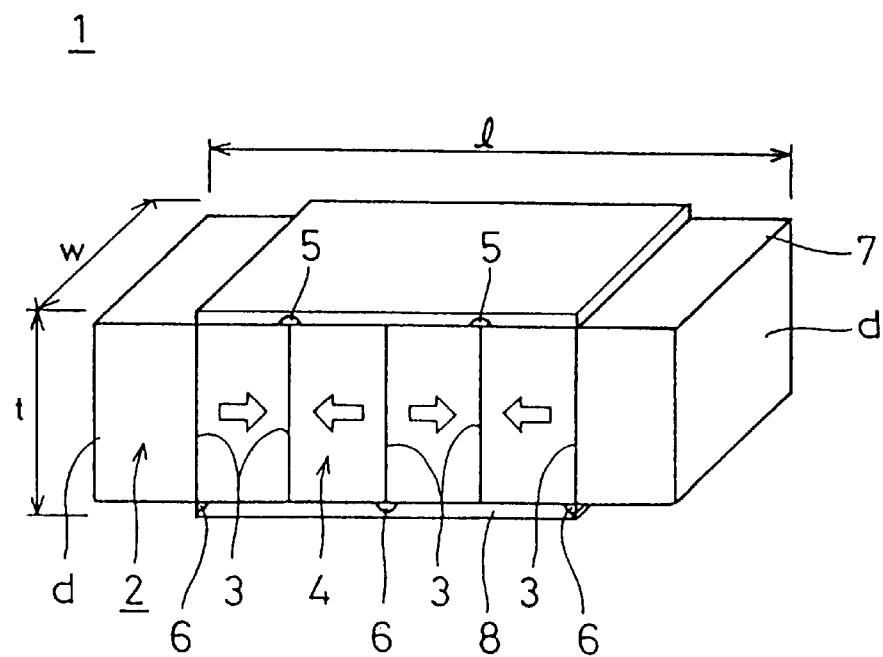
FIG. 5 is a view of a piezoelectric resonator shown for comparison.

FIG. 4 is a view showing an example of piezoelectric resonator according to a preferred embodiment of the present invention for checking the characteristics. FIG. 5 shows a piezoelectric resonator for comparison.

A piezoelectric resonator 10 shown in FIG. 4 measures approximately 3.78 mm in length, 1.0 mm in height, and 1.0 mm in width. At the center of a base member 12 of the piezoelectric resonator 10, a vibrating section 24 is formed by laminating four piezoelectric layers with electrodes 14 sandwiched therebetween. Capacitor sections 26 each including one dielectric layer sandwiched by electrodes 14 are integrally formed with the vibrating section 24 at opposite ends of the vibrating section 24. At each of the base member 12, an electrode 14 is provided. The piezoelectric layers and the dielectric layers constituting the base member 12 preferably have the same thickness.

A piezoelectric resonator 1 shown in FIG. 5 for comparison has the same dimensions as the piezoelectric resonator 10 shown in FIG. 4. At the center of a base member 2 of the piezoelectric resonator 1, a vibrating section 4 is formed by laminating four piezoelectric layers with electrodes 3 sandwiched therebetween. Inactive sections "d" are formed at opposite ends of the vibrating section 4. An electrode is preferably not provided at each end of the base member 2, and an external electrode is not disposed near the ends of the base member 2 where internal electrodes 3 are not provided. The piezoelectric layers constituting the base member 2 preferably have the same thickness.

In FIGS. 4 and 5, arrows indicate the directions of polarization in the piezoelectric layers.

To examine a difference in characteristics between these two piezoelectric resonators, the finite-element method is used to calculate the resonant frequencies Fr and the anti-resonant frequencies Fa of the piezoelectric resonator 10 shown in FIG. 4 and the piezoelectric 1 shown in FIG. 5, and their difference ΔF. Table 1 shows the results.

TABLE 1

|  | Fr (kHz) | Fa (KHz) | ΔF (kHz) |
|---|---|---|---|
| Piezoelectric resonator of this prevention | 470.7 | 515.1 | 44.4 |
| Piezoelectric resonator of comparison | 470.7 | 538.9 | 68.2 |

Figure 6:
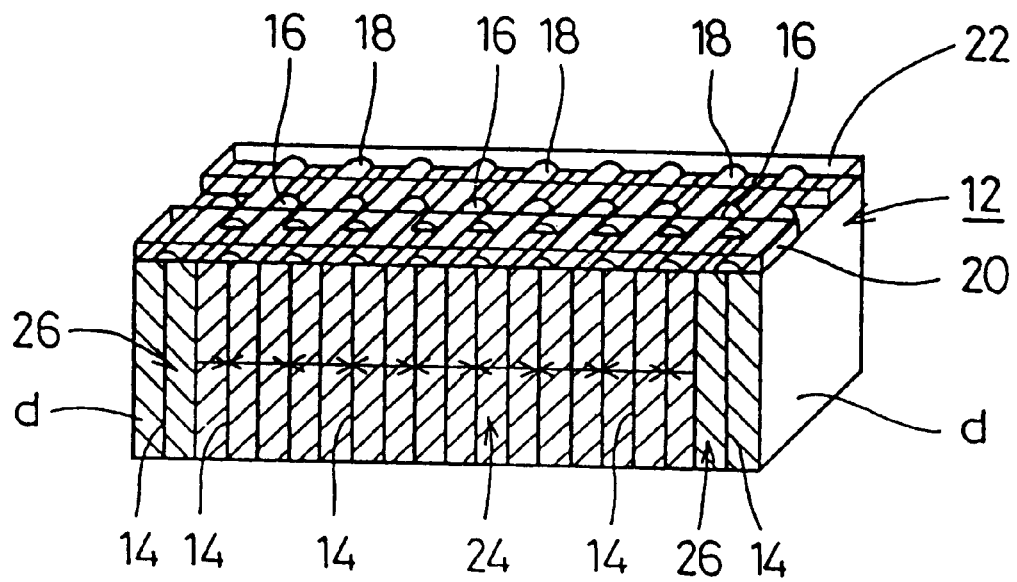
FIG. 6 is a view of another piezoelectric resonator according to a preferred embodiment to the present invention.

As shown in Table 1, the piezoelectric resonator 10 shown in FIG. 4 has a smaller ΔF than the piezoelectric resonator shown in FIG. 5 for comparison FIG. 6 is a view showing another piezoelectric resonator according to another preferred embodiment of the present invention. The basic configuration is preferably the same as that shown in FIG. 2. A piezoelectric resonator 10 shown in FIG. 6 differs from the resonator of the preferred embodiment shown in FIG. 2 in that two external electrodes 20 and 22 are disposed on one side surface of the base member 12. Insulating films 16 and 18 are disposed on one side surface of the base member 12 and are preferably arranged in a two-row pattern and two rows of connection sections are provided. These two rows of insulating films 16 and 18 are disposed on respective alternate electrodes 14. On these two rows of insulating films 16 and 18, two rows of external electrodes 20 and 22 are provided, respectively. The piezoelectric resonators 10 also achieve the same advantages as the piezoelectric resonator described above.

By disposing the two external electrodes 20 and 22 on one side surface of the base member 12 as described above, the piezoelectric resonator 10 is adapted to be surface-mounted on a circuit board to form an electronic component such as an oscillator or a discriminator.

Figure 7:
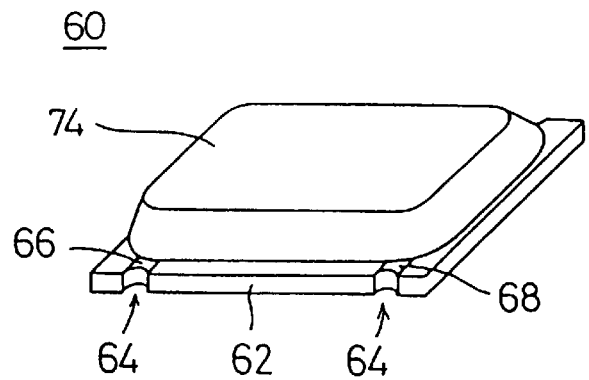
FIG. 7 is a perspective view of an electronic component using the piezoelectric resonator shown in FIGS. 1 and 2.
Figure 8:
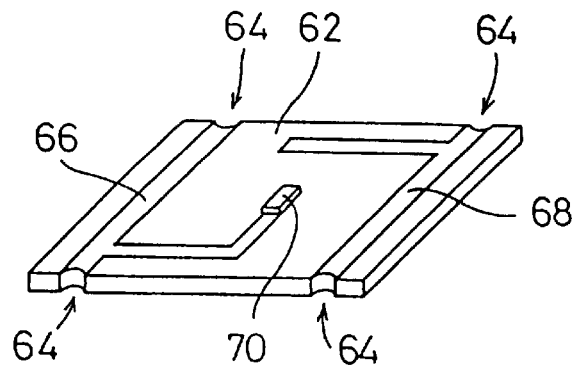
FIG. 8 is a perspective view of an insulating substrate used in the electronic component shown in FIG. 7.
Figure 9:
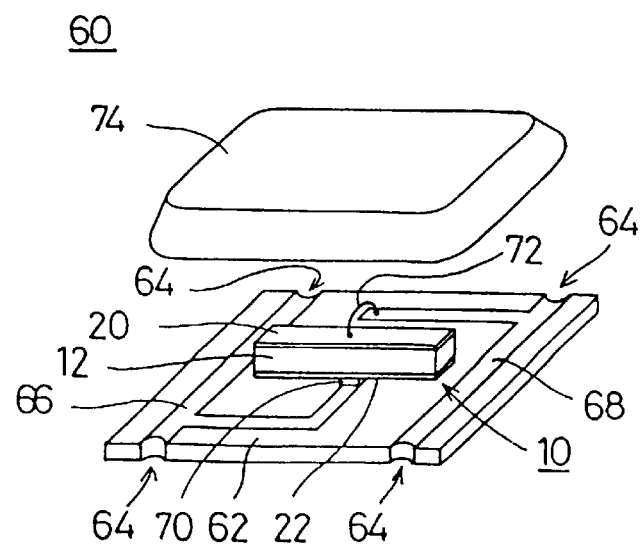
FIG. 9 is an exploded perspective view of the electronic component shown in FIG. 7.

An electronic component such as an oscillator and a discriminator including the piezoelectric resonator shown in FIGS. 1 and 2 will be described below by referring to FIGS. 7 to 9. FIG. 7 is a perspective view of an electronic component 60 according to a preferred embodiment of the present invention. The electronic component 60 includes an insulating substrate 62. At opposing end portions of the insulating substrate 62, two indentations 64 are preferably formed, respectively. On one surface of the insulating substrate 62, two pattern electrodes 66 and 68 are provided as shown in FIG. 8. One pattern electrode 66 is arranged between opposing indentations 64 and extends in a substantially L-shaped manner from a point near one end toward the center of the insulating substrate 62. The other pattern electrode 68 is arranged between other opposing indentations 64 and extends substantially straight from a point near the other end toward the center of the insulating substrate 62. The pattern electrodes 66 and 68 are arranged such that they are routed in a roundabout fashion from the ends of the insulating substrate 62 to the opposite surface.

At one end of the pattern electrode 66 disposed substantially at the center of the insulating substrate 62, a mounting member 70 is formed preferably with electrically conductive adhesive. As shown in FIG. 9, the above-described piezoelectric resonator 10 is mounted on the mounting member 70 such that the approximate center of the base member 12 in the longitudinal direction is disposed on the mounting member 70. An external electrode 22 of the piezoelectric resonator 10 is, for example, united with the mounting member 70 to connect to the pattern electrode 66. The other external electrode 20 is connected to the pattern electrode 68 preferably via electrically conductive wire 72. The electrically conductive wire 72 is preferably connected to the center of the external electrode 20 of the piezoelectric resonator 10. The mounting member 70 may be first mounted at the center of the external electrode 20 in the piezoelectric resonator 10. In this case, the mounting member 70 mounted on the piezoelectric resonator 10 is mounted to the pattern electrode 66 with electrically conductive adhesive.

A metal cap 74 is placed on the insulating substrate 62 to complete the electronic component 60. To prevent the metal cap 74 from being short-circuited to the pattern electrodes 66 and 68, insulating resin is preferably applied to the insulating substrate 62 and the pattern electrodes 66 and 68 in advance. The electronic component 60 uses the pattern electrodes 66 and 68, which are arranged such that they are routed to the rear surface from ends of the insulating substrate 62, as input and output terminals for connecting to external circuits.

Since the approximate center of the piezoelectric resonator 10 in the longitudinal direction is secured to the mounting member 70 in the electronic component 60, the ends of the piezoelectric resonator 10 are disposed separately from the insulating substrate 62 so vibration is not prevented or damped. Excited longitudinal vibration is not weakened because the center of the piezoelectric resonator 10, which serves as a node, is secured to the mounting member 70 and is connected to the electrically conductive wire 72.

The electronic component 60 is mounted on a circuit board together with IC chips and other components to form an oscillator or a discriminator. Since the electronic component 60 is sealed and protected by the metal cap 74, it can be used as a chip-type surface mountable component which can be mounted by reflow soldering or other suitable method.

When the electronic component 60 is used in an oscillator, spurious vibrations are suppressed to a low level and unusual vibration caused by the spurious vibrations are prevented because of the novel features of the piezoelectric resonator 10 used in the electronic component 60. It is also easy to achieve impedance matching with an external circuit since the capacitance of the piezoelectric resonator 10 can easily be set to any desired value.

When the electronic component 60 is used for a discriminator, a narrow peak-separation range is provided due to a small $\Delta F$ of the resonator. In addition, since the resonator provides a wide range of flexibility in capacitance design, it is easy to achieve impedance matching with an external circuit.

Figure 10:
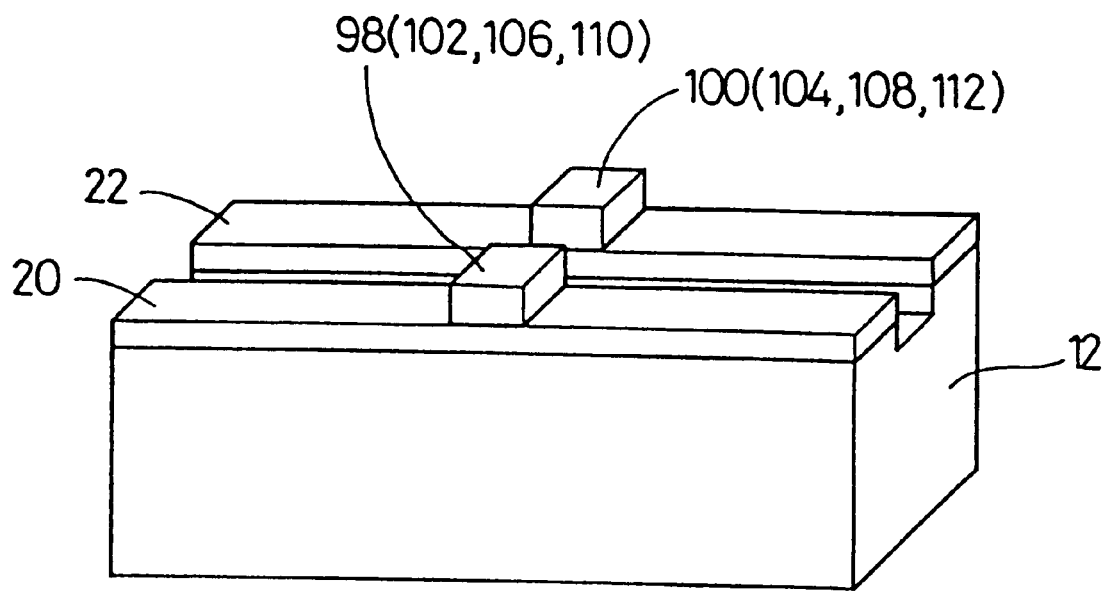
FIG. 10 is a perspective view of a piezoelectric resonator used for another electronic component according to another preferred embodiment of the present invention.
Figure 11:
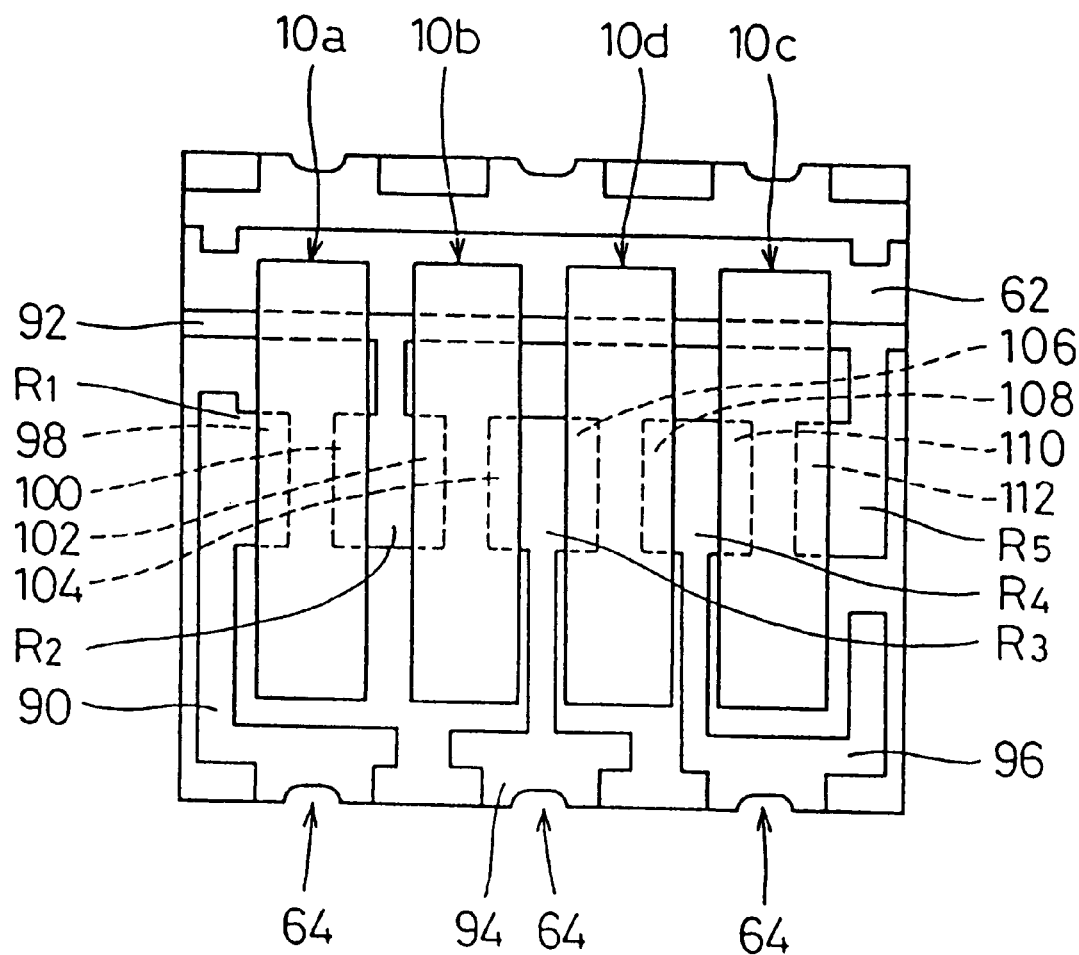
FIG. 11 is a perspective view of the main section of the electronic component using the piezoelectric resonator shown in FIG. 10.
Figure 12:
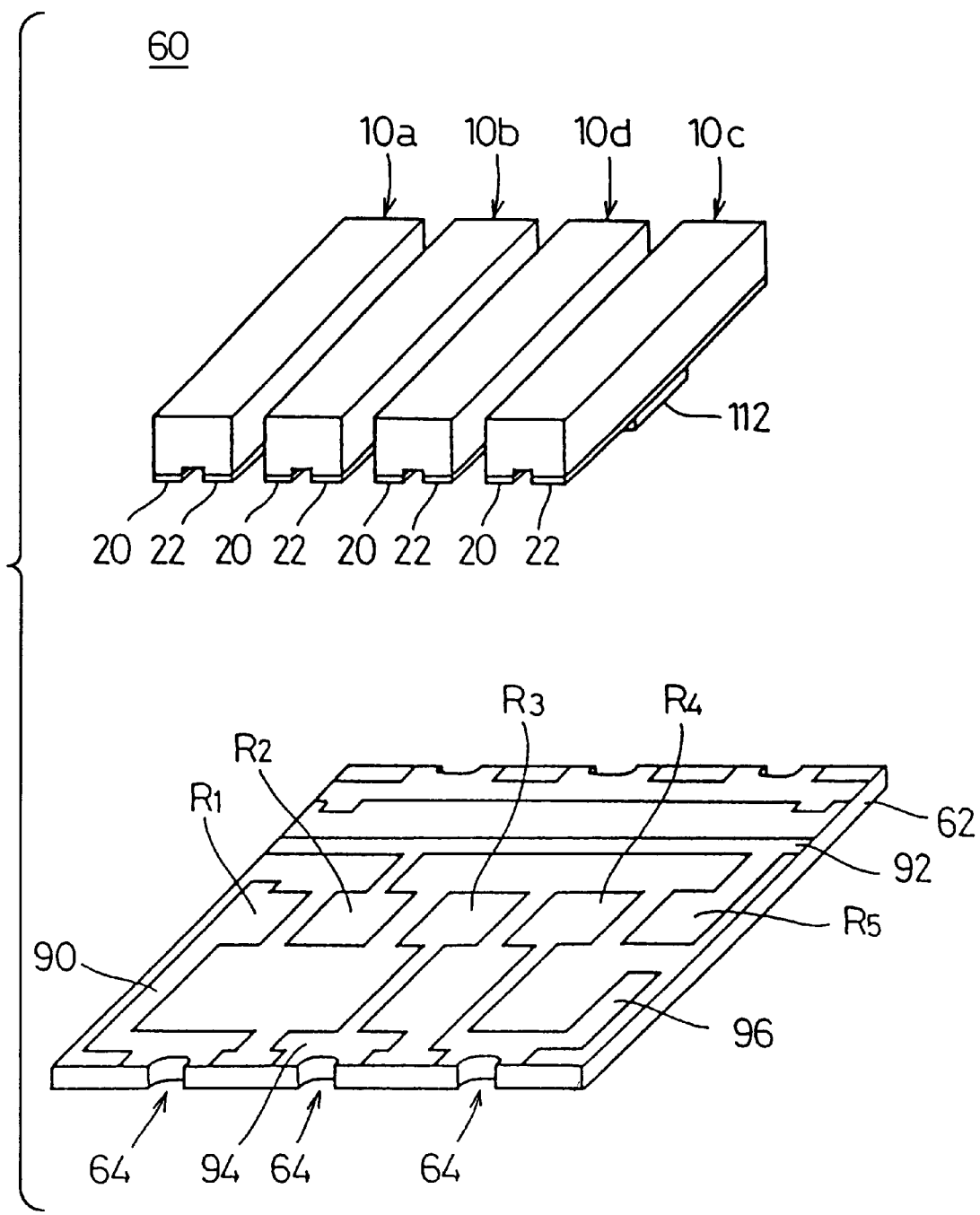
FIG. 12 is an exploded perspective view of the main section of the electronic component shown in FIG. 11.

FIG. 11 is a plan view of a main section of an electronic component used as a ladder filter having a ladder-shaped circuit. FIG. 12 is an exploded perspective view of the main section. In the electronic component 60 shown in FIGS. 11 and 12, four piezoelectric resonators 10a, 10b, 10c, and 10d all of which have the shape shown in FIG. 10. The internal structure of each of these piezoelectric resonators 10a to 10d is the same as that of the piezoelectric resonator shown in FIG. 6 and is arranged so as to be able to be surface-mounted.

In the electronic component 60 shown in FIGS. 11 and 12, four pattern electrodes 90, 92, 94, and 96 are preferably provided on an insulating substrate 62 serving as a support member. Five lands disposed in line at a certain interval are formed on the pattern electrodes 90, 92, 94, and 96. The first land R1, which is closest to an end of the insulating substrate G2, is formed on the pattern electrode 90, the second land R2 and the fifth land R5 are formed on the pattern electrode 92, the third land R3 is formed on the pattern electrode 94, and the fourth land R4 is formed on the pattern electrode 96.

To connect the piezoelectric resonators 10a to 10d to the first land R1 to the fifth land R5, substantially rectangular-block-shaped mounting members 98, 100, 102, 104, 106, 108, 110, and 112 in which at least their surfaces are made from an electrically conductive member are prepared. These mounting members are mounted on the electrodes 20 and 22 disposed at the node sections of the piezoelectric resonators 10a to 10d in advance with electrically conductive adhesive as shown in FIG. 10.

The piezoelectric resonators 10a to 10d are turned upside down and mounted with electrically conductive adhesive as shown in FIG. 11: one mounting member 98 on the first land R1; two mounting members 100 and 102 on the second land R2; two mounting members 104 and 106 on the third land R3; two mounting members 108 and 110 on the fourth land R4, and one mounting member 112 on the fifth land R5. In this case, the mounting members are disposed in line at a certain interval as shown in FIG. 11.

Figure 13:
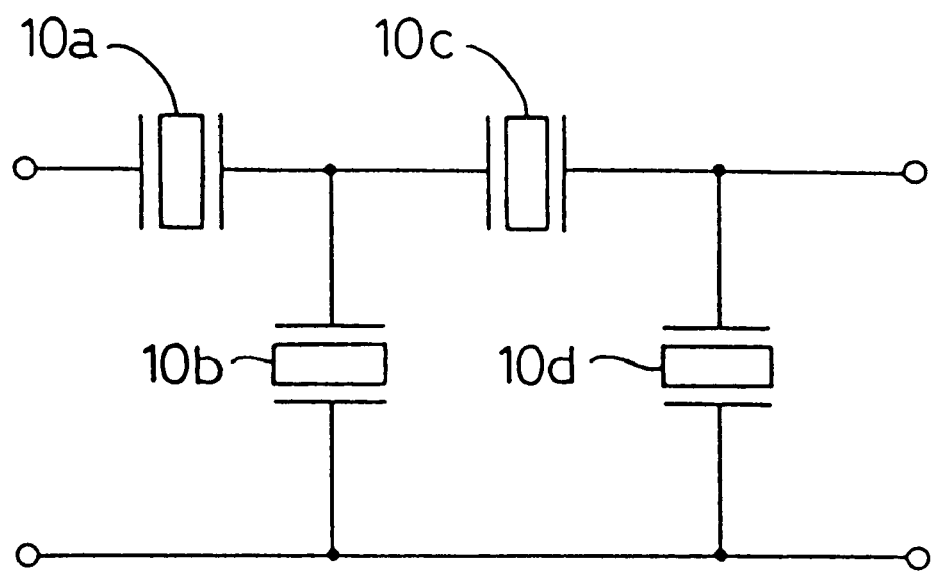
FIG. 13 is a circuit diagram of the electronic component shown in FIGS. 10 and 11.

As described above, the four piezoelectric resonators 10a to 10d are supported on the insulating substrate 62 by the mounting members 98, 100, 102, 104, 106, 108, 110, and 112, and the electrodes 20 and 22 of the piezoelectric resonators are connected to the pattern electrodes 90, 92, 94, and 96 on the insulating substrate 62. The pattern electrodes are formed such that the ladder-shaped circuit shown in FIG. 13 is obtained. A metal cap (not shown) is placed on the insulating substrate 62.

The electronic component 60 is used as a ladder filter having the ladder-shaped circuit shown in FIG. 13. Two piezoelectric resonators 10a and 10c preferably serve as series resonators and the other two piezoelectric resonator 10b and 10d preferably serve as parallel resonators. In such a ladder filter, the parallel piezoelectric resonators 10b and 10d are designed to have substantially larger capacitances than the series piezoelectric resonators 10a and 10c.

Attenuation in the ladder filter is determined by the capacitance ratio between the series resonators and the parallel resonators. In this electronic component 60, a ladder filter having a larger attenuation with fewer resonators is implemented by changing the capacitances of the piezoelectric resonators. Since the piezoelectric resonators 10a to 10d have a smaller $\Delta F$, a ladder filter having a narrow transmission frequency band is implemented.

In the electronic component shown in FIGS. 11 and 12, since one electrode of each of adjacent piezoelectric resonators is mounted on the same land via a mounting member, the two electrodes of the adjacent piezoelectric resonators do not need to be insulated and thus the adjacent resonators can be disposed closely, enabling a substantially compact component.

Since the piezoelectric resonators 10 having the structure shown in FIG. 6 or 10 can be secured to the insulating substrate 62 with surface-mounting without use of wire, a ladder filter is manufactured more easily.

Figure 14:
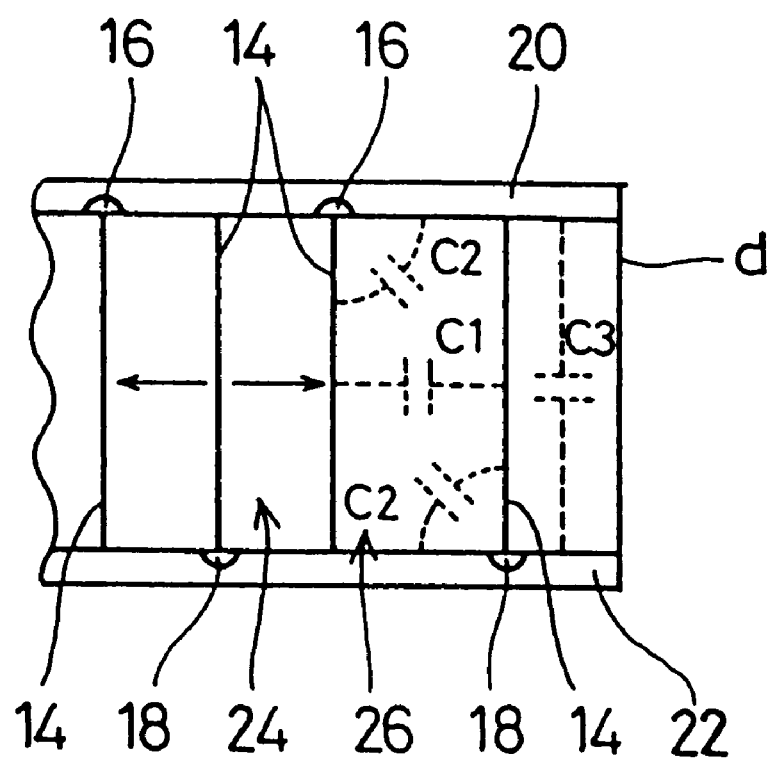
FIG. 14 is a view illustrating capacitors formed in a capacitor section.
Figure 15:
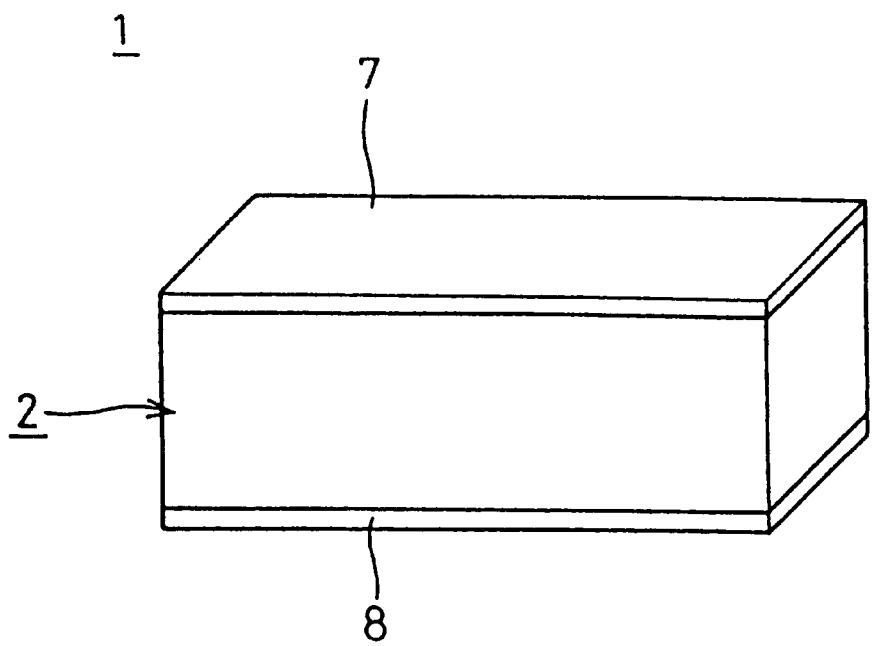
FIG. 15 is a perspective view of a piezoelectric resonator which the applicant has developed but not yet published.
Figure 16:
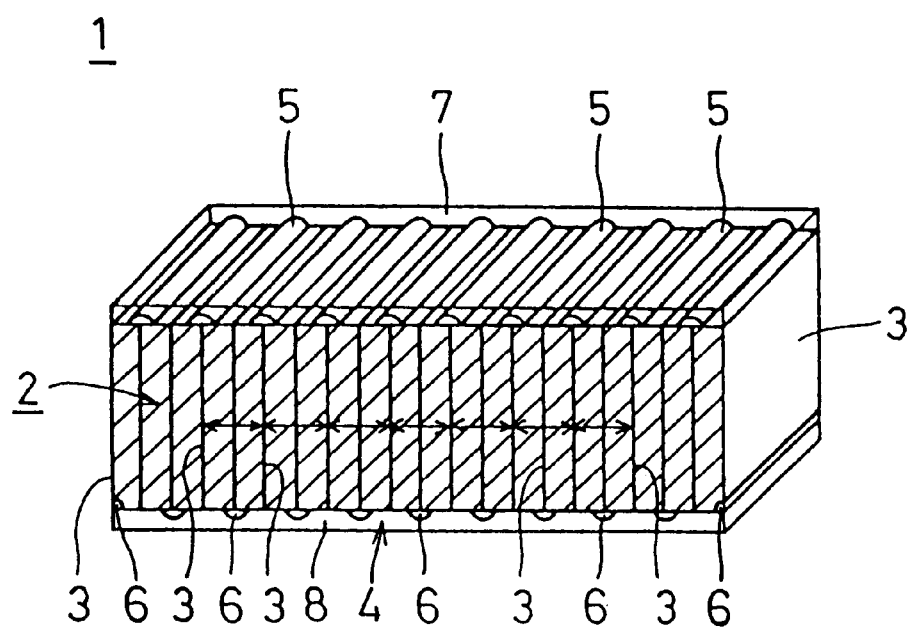
FIG. 16 is a view showing the internal structure of the piezoelectric resonator shown in FIG. 15.

In a piezoelectric resonator 10 according to the preferred embodiments of the present invention, a capacitor C1 is defined between a plurality of electrodes 14 because dielectric layers and electrodes 14 are laminated as shown in FIG. 14. In addition to the capacitor C1, in the capacitor sections 26, a capacitor C2 is defined between the external electrode 20 and the electrode 14 disposed at an end of the vibrating section 24, and a capacitor C2 is also defined between the external electrode 22 and the electrode 14 sandwiched by dielectric layers. Furthermore, a capacitor C3 is defined between the external electrodes 20 and 22.

The capacitor C1 can easily be adjusted by changing the number of laminated layers formed by dielectric layers and electrodes 14 and the thickness of a dielectric layer. The capacitors C2 can be easily adjusted by changing the number of electrodes 14 disposed in the inactive section "d" and the areas of the external electrodes 20 and 22. The capacitor C3 can also be adjusted by changing the areas of the external electrodes 20 and 22. It is a matter of course that the capacitors C1, C2, and C3 are adjusted by changing the material of dielectric layers.

The combined capacitance of these capacitors C1, C2, and C3 is connected in parallel to the vibrating section 24. Therefore, if an electrode 14 is not defined in the capacitor sections 26, the capacitor C3 is defined between the external electrodes 20 and 22, and is connected in parallel to the vibrating section 24. At least one of the capacitors C1, C2, and C3 is preferably provided in the capacitor section 26. Therefore, it is not necessary to provide an electrode 14 in the dielectric member of the capacitor section 26. The capacitance of the capacitor section 26 can be easily adjusted by changing the areas of the external electrodes 20 and 22 formed in the inactive section "d." When the inactive section "d" has a structure in which a capacitor is defined between the external electrodes 20 and 22, the above-described advantages are obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
   a base member;
   a vibrating section constituting a first part of said base member and including at least one piezoelectric member and at least one pair of electrodes, said at least one pair of electrodes being arranged on opposite surfaces of said piezoelectric member and disposed substantially perpendicularly to a longitudinal direction of said base member;
   a capacitor section constituting a second part of said base member and being electrically connected to said vibrating section;
   means for driving said base member for vibrating said base member; wherein
   said piezoelectric member in said vibrating section is polarized in the longitudinal direction of said base member and said means for driving said base member applies an electric field to said base member between said at least one pair of electrodes to generate basic longitudinal vibration in said base member such that a vibration node at which substantially no vibration occurs is defined at an approximate center of said base member.

2. A piezoelectric resonator according to claim 1, wherein said capacitor is connected in parallel to said vibrating section.

3. A piezoelectric resonator according to one claim 1, wherein said vibrating section includes a plurality of said piezoelectric members and a plurality of said electrodes which are alternately laminated.

4. A piezoelectric resonator according to claim 1, wherein said capacitor section is disposed at a periphery of said vibrating section.

5. A piezoelectric resonator according to claim 1, further comprising at least one pair of external electrodes disposed on an outer surface of said base member and connected to said at least one pair of electrodes, wherein said capacitor section is connected between said external electrodes and electrically connected in parallel to said vibrating section.

6. A piezoelectric resonator comprising:
   a base member;
   a vibrating section constituting a first part of said base member and including at least one piezoelectric member and at least one pair of electrodes which sandwich at least a part of said piezoelectric member and are disposed substantially perpendicularly to a longitudinal direction of said base member; and
   a capacitor section constituting a second part of said base member and being electrically connected to said vibrating section;
   means for driving said base member for vibrating said base member; wherein
   said at least one piezoelectric member in said vibrating section is polarized in the longitudinal direction of said base member and said means for driving said base member applies an electric field to said base member between said at least one pair of electrodes to generate basic longitudinal vibration in said base member such that a vibration node at which substantially no vibration occurs is defined at an approximate center of said base member, and
   said capacitor section has a capacitor including a pair of electrodes disposed on a dielectric member which is not polarized.

7. A piezoelectric resonator according to claim 6, further comprising at least one pair of external electrodes disposed on an outer surface of said base member and connected to said at least one pair of electrodes, wherein said capacitor section is connected between said external electrodes and electrically connected in parallel to said vibrating section.

8. A piezoelectric resonator according to claim 6, wherein said capacitor is connected in parallel to said vibrating section.

9. A piezoelectric resonator according to one claim 6, wherein said vibrating section includes a plurality of said piezoelectric members and a plurality of said electrodes which are alternately laminated.

10. A piezoelectric resonator according to claim 6, wherein said capacitor section is disposed at a periphery of said vibrating section.

11. A piezoelectric resonator comprising:
    a base member;
    a vibrating section constituting a first part of said base member and including at least one piezoelectric member and at least one pair of internal electrodes which sandwich at least a part of said piezoelectric member and are disposed substantially perpendicularly to a longitudinal direction of said base member;
    a capacitor section constituting a second part of said base member and being electrically connected to said vibrating section; and
    at least one pair of external electrodes disposed on an outer surface of said base member and electrically connected to said internal electrodes;

means for driving said base member for vibrating said base member; wherein said piezoelectric member in said vibrating section is polarized in the longitudinal direction of said base member and said means for driving said base member applies an electric field to said base member between said internal electrodes in the longitudinal direction to generate basic longitudinal vibration in said base member such that a vibration node at which substantially no vibration occurs is defined at an approximate center of said base member, and said capacitor section includes a capacitor including at least one pair of external electrodes disposed at an outer surface of a non-polarized dielectric member constituting a part of said base member.

12. A piezoelectric resonator according to claim 11, wherein said capacitor is connected in parallel to said vibrating section.

13. A piezoelectric resonator according to one claim 11, wherein said vibrating section includes a plurality of said piezoelectric members and a plurality of said electrodes which are alternately laminated.

14. A piezoelectric resonator according to claim 11, wherein said capacitor section is disposed at a periphery of said vibrating section.

15. An electronic component comprising:

a piezoelectric resonator including a base member, a vibrating section constituting a first part of said base member and including at least one piezoelectric member and at least one pair of electrodes, said at least one pair of electrodes being arranged on opposite surfaces of said piezoelectric member and disposed substantially perpendicularly to a longitudinal direction of said base member, a capacitor section constituting a second part of said base member and being electrically connected to said vibrating section, and means for driving said base member for vibrating said base member, wherein said piezoelectric member in said vibration section is polarized in the longitudinal direction of said base member and said means for driving said base member applies an electric field to said base member between said at least one pair of electrodes to generate basic longitudinal vibration in said base member such that a vibration node at which point substantially no vibration occurs is defined at an approximate center of said base member;

a support member supporting said base member;

a mounting member being arranged such that said base member is mounted on said support member via said mounting member; and a cap disposed on said support member so as to cover said base member.

16. An electronic component according to claim 15, wherein said support member includes an insulating substrate having a pattern electrode disposed on a surface thereof.

17. An electronic component according to claim 15, wherein said mounting member is arranged to support a center section of said base member of said piezoelectric resonator on said support member.

18. An electronic component comprising:

a plurality of piezoelectric resonators each including a base member, a vibrating section constituting a first part of said base member and including at least one piezoelectric member and at least one pair of electrodes, said at least one pair of electrodes being arranged on opposite surfaces of said piezoelectric member and are disposed substantially perpendicularly to a longitudinal direction of said base member, and a capacitor section constituting a second part of said base member and being electrically connected to said vibrating section, and means for driving said base member for vibrating said base member, wherein said piezoelectric member in said vibrating section is polarized in the longitudinal direction of said base member and said means for driving said base member applies an electric field to said base member between said at least one pair of electrodes to generate basic longitudinal vibration in said base member such that a vibration node at which point substantially no vibration occurs is defined at an approximate center of said base member, wherein said plurality of piezoelectric vibrators are arranged in a ladder arrangement to define a ladder type filter;

a support member supporting said plurality of piezoelectric resonators;

a plurality of mounting members being arranged such that plurality of piezoelectric resonators are mounted on said support member via said mounting members; and a cap disposed on said support member so as to cover said plurality of piezoelectric resonators.

19. An electronic component according to claim 18, wherein said support member includes an insulating substrate having a pattern electrode disposed on a surface thereof.

20. An electronic component according to claim 18, wherein respective ones of said plurality of mounting members are arranged to support a center section of corresponding ones of said plurality of piezoelectric resonators on said support member.

* * * * *